(12) United States Patent
Zhou et al.

(10) Patent No.: US 9,040,408 B1
(45) Date of Patent: May 26, 2015

(54) TECHNIQUES FOR WAFER-LEVEL PROCESSING OF QFN PACKAGES

(71) Applicant: Maxim Integrated Products, Inc., San Jose, CA (US)

(72) Inventors: Tiao Zhou, Carrollton, TX (US); Joseph W. Serpiello, Plano, TX (US); Md. Kaysar Rahim, Irving, TX (US); Yong L. Xu, Plano, TX (US); Karthik Thambidurai, Plano, TX (US); Viren Khandekar, Flower Mound, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/134,171

(22) Filed: Dec. 19, 2013

Related U.S. Application Data

(60) Provisional application No. 61/779,108, filed on Mar. 13, 2013.

(51) Int. Cl.
*H01L 21/44* (2006.01)
*H01L 23/48* (2006.01)
*H01L 23/00* (2006.01)

(52) U.S. Cl.
CPC .............. *H01L 24/11* (2013.01); *H01L 24/80* (2013.01)

(58) Field of Classification Search
CPC ......... H01L 24/10; H01L 24/11; H01L 24/12; H01L 24/80
USPC ......... 438/108, 109, 124, 126, 127, 613, 614; 257/737, 780, 781, 787
See application file for complete search history.

(56) References Cited

U.S. PATENT DOCUMENTS

| | | | |
|---|---|---|---|
| 6,998,710 B2 * | 2/2006 | Kobayashi et al. | 257/728 |
| 7,799,608 B2 * | 9/2010 | Chan et al. | 438/108 |
| 7,923,304 B2 * | 4/2011 | Choi et al. | 438/127 |
| 8,531,032 B2 * | 9/2013 | Yu et al. | 257/738 |
| 8,742,579 B2 * | 6/2014 | Pagaila et al. | 257/741 |
| 2009/0032971 A1 * | 2/2009 | Chan et al. | 257/777 |
| 2011/0057308 A1 * | 3/2011 | Choi et al. | 257/737 |

* cited by examiner

*Primary Examiner* — Kevin M Picardat
(74) *Attorney, Agent, or Firm* — Advent, LLP

(57) ABSTRACT

Semiconductor package devices, such as wafer-level package semiconductor devices, are described that have pillars for providing electrical interconnectivity. In an implementation, the wafer-level package devices include an integrated circuit chip having at least one pillar formed over the integrated circuit chip. The pillar is configured to provide electrical interconnectivity with the integrated circuit chip. The wafer-level package device also includes an encapsulation structure configured to support the pillar.

22 Claims, 17 Drawing Sheets

TECHNIQUES FOR WAFER-LEVEL PROCESSING OF QFN PACKAGES

CROSS REFERENCE TO RELATED APPLICATIONS

The present application claims the benefit under 35 U.S.C. §119(e) of U.S. Provisional Application Ser. No. 61/779,108, entitled TECHNIQUES FOR WAFER-LEVEL PROCESSING OF QFN PACKAGES, filed Mar. 13, 2013. U.S. Provisional Application Ser. No. 61/779,108 is hereby incorporated by reference in its entirety.

BACKGROUND

Flat no-lead packaging technologies, such as quad-flat no-leads (QFN) packaging technologies, physically and electrically connect integrated circuit chips to printed circuit boards. Flat no-lead packaging technologies typically employ a lead-frame that includes an integrated circuit chip (die) mounted thereon. The die may be electrically interconnected with the lead-frame through wire-bonding technology or flip-chip technology. An encapsulation structure is then formed over the lead-frame to encapsulate the integrated circuit chip.

SUMMARY

Techniques are described for fabricating wafer-level package semiconductor devices that have form factors similar to those of devices that employ flat no-lead (e.g., QFN) packaging technologies. In one or more implementations, the wafer-level package devices include an integrated circuit chip (e.g., die) having at least one pillar (e.g., a copper pillar) formed over the integrated circuit chip. The pillar is configured to provide electrical interconnectivity to the integrated circuit chip. An encapsulation structure configured to support the pillar is formed over the surface of the integrated circuit chip. In one or more implementations, a second integrated circuit device may be mounted to the integrated circuit chip so that the integrated circuit device is in electrical communication with the integrated circuit chip. The second integrated circuit device is at least partially encapsulated by the encapsulation structure.

In one or more implementations, a portion of the encapsulation structure is etched to remove an outer section of the encapsulation structure so that a portion of the pillar extends beyond the encapsulation structure. The solder layer is applied to the pillar so that the solder layer extends over at least part of a sidewall of the portion of the at least one pillar that extends beyond the encapsulation structure.

In one or more implementations, under bump metallization (UBM) is applied over the pillar. The solder layer is applied to the under bump metallization (UBM) so that the solder layer extends over at least part of a sidewall of the under bump metallization (UBM). In embodiments, a redistribution layer (RDL) may be provided over the encapsulation structure and pillar to electrically connect the pillar and the under bump metallization (UBM).

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1A:
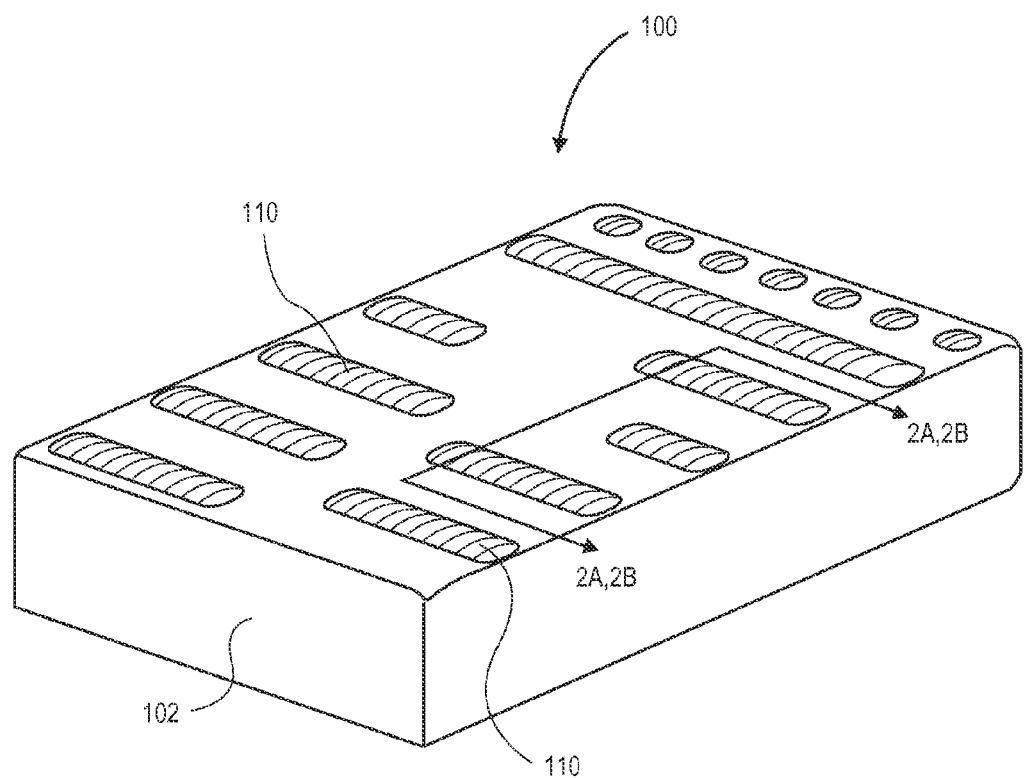
FIGS. 1A and 1B are diagrammatic perspective elevation views illustrating a wafer-level package device in accordance with an example implementation of the present disclosure.
Figure 1B:
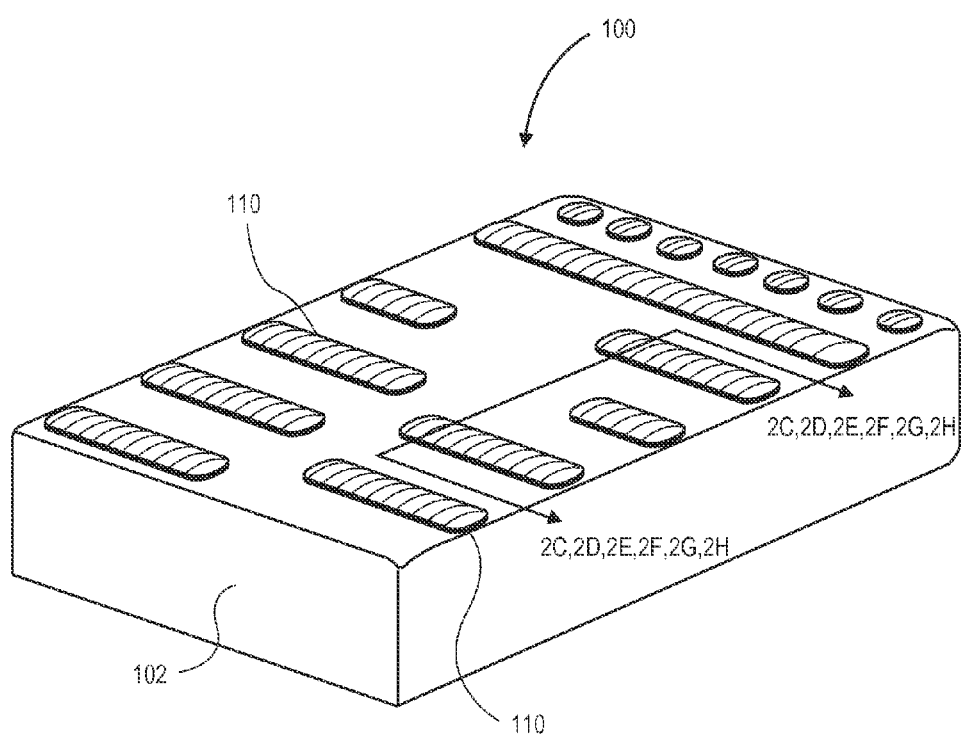

Devices that employ flat no-lead packaging technologies, such as QFN packaging technologies, provide good mechanical protection to the integrated circuit chips (dies) contained within the device packages by fully encapsulating the integrated circuit chips within the package. However, flat no-lead (e.g., QFN) package devices are expensive to produce and typically provide relatively low pin counts (e.g., the pins of a QFN are typically located along the die edge).

Wafer-level packaging is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level. Compared to flat no-lead (QFN) packaging techniques, wafer-level packaging is generally less costly to implement since packaging occurs at wafer level, while flat no-lead packaging is performed at strip level. Moreover, the footprint of a comparable wafer-level packaged device is typically less than that of a QFN packaged device since wafer-level packages can be nearly equal to the size of the integrated circuit chip.

Accordingly, techniques are described that employ wafer-level packaging techniques to fabricate semiconductor devices that have form factors similar to those of devices that employ flat no-lead (QFN) packaging technologies. The wafer-level package devices may thus provide mechanical protection of the integrated circuit chips (dies) contained within the device packages that is similar to that provided by flat no-lead (QFN) devices, while maintaining the benefits inherent in wafer-level packaging (e.g., lower cost, smaller package size, high pin count, etc.). The wafer-level package devices include an integrated circuit chip (e.g., a die) having pillars that provide electrical interconnectivity to the devices. In specific implementations, the pillars may be copper pillars having a solder layer formed over the exposed end of the pillar. An encapsulation structure configured to support the pillar is formed over the surface of the integrated circuit chip at wafer level. In embodiments, the encapsulation structure may be fabricated from epoxy, or a like substance. In one or more implementations, a second integrated circuit device may be mounted to the integrated circuit chip so that the integrated circuit device is in electrical communication with the integrated circuit chip. The second integrated circuit device is at least partially encapsulated by the encapsulation structure. Once singulated from the wafer, the devices may be mounted to a printed circuit board, and the pillars provide electrical interconnectivity through the backside of the device that interfaces with the pads of the printed circuit board.

In one or more implementations, a portion of the encapsulation structure is etched to remove an outer section (layer) of the encapsulation structure so that a portion of the pillar extends beyond the encapsulation structure. The encapsulation structure may be etched using a dry etch process, such as a plasma etch process, or the like, or may be etched using a wet etch process. The solder layer is then applied to the pillar so that the solder layer extends over at least part of the sidewall of the portions of the pillars that extend beyond the encapsulation structure. In other implementations, under bump metallization (UBM) is applied over the pillar and encapsulation structure instead of etching the encapsulation structure. The solder layer is applied to the under bump metallization (UBM) so that the solder layer extends over at least part of a sidewall of the under bump metallization (UBM). In embodiments, a redistribution layer (RDL) may be provided over the encapsulation structure and pillar to electrically connect the pillar and the under bump metallization (UBM), thereby facilitating redistribution of the connections of the package. In this manner, stress is shifted away from the solder/copper interface where the solder layer joins the surface of the pillar, increasing the robustness of the structure.

Example Implementations

FIGS. 1A and 1B, and 2A through 2H illustrate semiconductor package devices 100 in accordance with example implementations of the present disclosure. In some implementations, the semiconductor package devices 100 may comprise wafer-level integrated circuit package devices. As shown, the devices 100 include an integrated circuit chip (die) 102 comprised of a semiconductor substrate 104 having one or more integrated circuits 106 formed therein. In various implementations, the integrated circuits 106 may comprise digital integrated circuits, analog integrated circuits, mixed signal integrated circuits, combinations thereof, and so forth. The integrated circuits 106 may be formed through suitable front-end-of-line (FEOL) fabrication techniques.

The device 100 further includes pillars 108 extending from a surface 111 of the semiconductor substrate 104. In an implementation, the pillars 108 are copper pillars fabricated via suitable manufacturing processes, such as the dual lamination/deposition process described herein. The pillars 108 may have an aspect ratio (ratio of the width of the pillar to the height of the pillar) ranging from about one to one (1:1) to about twenty to one (20:1). In a specific example, the aspect ratio may range from about five to one (5:1) to about fifteen to one (15:1). The pillars 108 serve to provide electrical interconnections between the integrated circuit chip 102 and a printed circuit board that is configured to receive the device 100. A solder layer 110 serves as a connection between the device 100 (e.g., the pillars 108) and corresponding pads disposed over the printed circuit board. In implementations, the solder layer 110 shown in FIGS. 2A through 2H may be fabricated of a lead-free solder composition such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on.

In some implementations, the device 100 may include a second integrated circuit device 114 (e.g., an integrated circuit package device) disposed over (and mounted to) the surface 111 of the integrated circuit chip 102. In embodiments, the second integrated circuit device 114 may be in electrical communication with the integrated circuits 106 of the integrated circuit chip 102. For instance, as shown in FIGS. 2B, 2D, 2F, and 2H, the integrated circuit device 114 includes solder bumps 116 that allow the device 114 to be in electrical contact with the device 100. The solder bumps 116 may, for example, be positioned over a redistribution structure, such as a redistribution layer (RDL) 118, of the wafer-level chip-scale device 100 to allow electrical communication between the device 114 and the device 100 (e.g., the integrated circuits 106, etc.). The RDL 118 may be formed from a conductive material, such as polysilicon, aluminum, copper, and so on. Thus, the integrated circuit device 114 extends additional functionality to the device 100 by enabling system-in-a-package capabilities. In implementations, the integrated circuit device 114 may be a digital integrated circuit device, an analog integrated circuit device, a mixed-signal integrated circuit device, and so forth. As with the solder layer 110 described above, the solder bumps 116 may be fabricated of a lead-free solder composition such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on. However, it is contemplated that Tin-Lead (PbSn) solder compositions may be used.

The device 100 also includes an encapsulation structure 120 disposed over the surface 111 of the integrated circuit chip 102. As shown in FIG. 2A through 2H, the encapsulation structure 120 at least substantially encapsulates the pillars 108. Thus, the encapsulation structure 120 provides support and insulation to the pillars 108 (and the integrated circuit device 114 when the device 100 employs an integrated circuit device 114). In an implementation, the encapsulation structure 120 may be a polymer material, such as epoxy, or the like, deposited over the surface 111 of the wafer-level chip-scale package device 100.

Figure 2A:
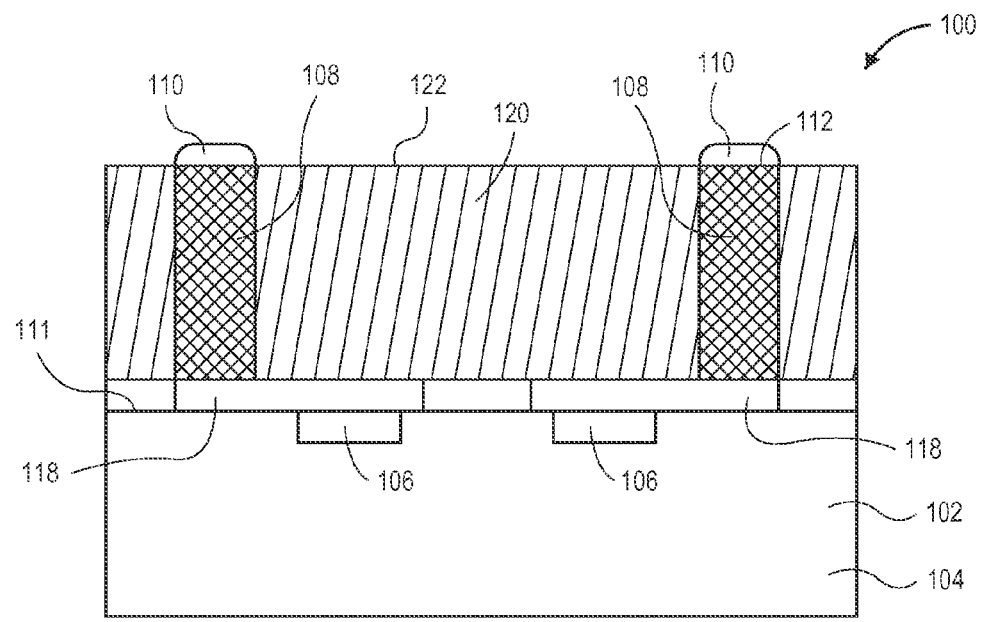
FIG. 2A is a diagrammatic partial-cross-sectional side elevation view of an example section of the wafer-level package device as shown in FIG. 1A taken along plane 2A-2A.
Figure 2B:
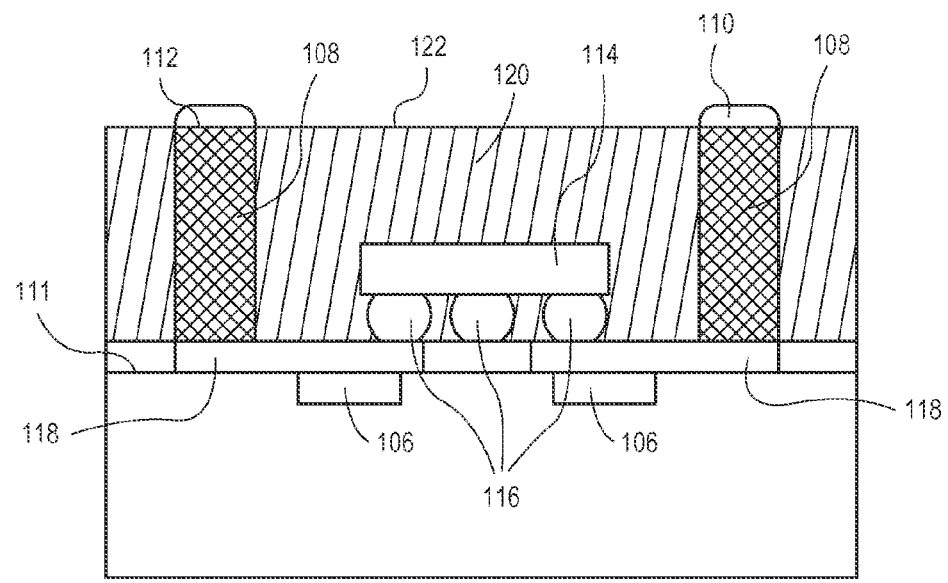
FIG. 2B is a diagrammatic partial-cross-sectional side elevation view of an example section of the wafer-level package device as shown in FIG. 1A taken along plane 2B-2B, wherein the wafer-level package device includes an integrated circuit device.

In the embodiments shown in FIGS. 2A and 2B, the solder layer 110 is disposed over the exposed surfaces 112 of the respective pillars 108 (e.g., the surface of the end distal from the substrate 104) to serve as a connection between the device 100 (e.g., the pillars 108) and corresponding pads disposed over the printed circuit board. In such embodiments, the pillars 108 have a length that at least substantially extends to the depth of the encapsulation structure 120 so that the outer surfaces 112 of the pillars 108 are substantially flush with a plane defined by the surface 122 of the encapsulation structure 120. Thus, the solder layers 110 are disposed over the exposed surfaces 112 of the respective pillars 108 and extend beyond the plane defined by the surface 122 of the encapsulation structure 120 to allow the solder layer 110 to connect to the corresponding pad of the printed circuit board. As shown, the solder of the solder layers 110 may at least substantially cover the respective surfaces 112 of the pillars 108 (e.g., wet the entire portion of the surfaces 112 exposed from the encapsulation structure 120).

Figure 2C:
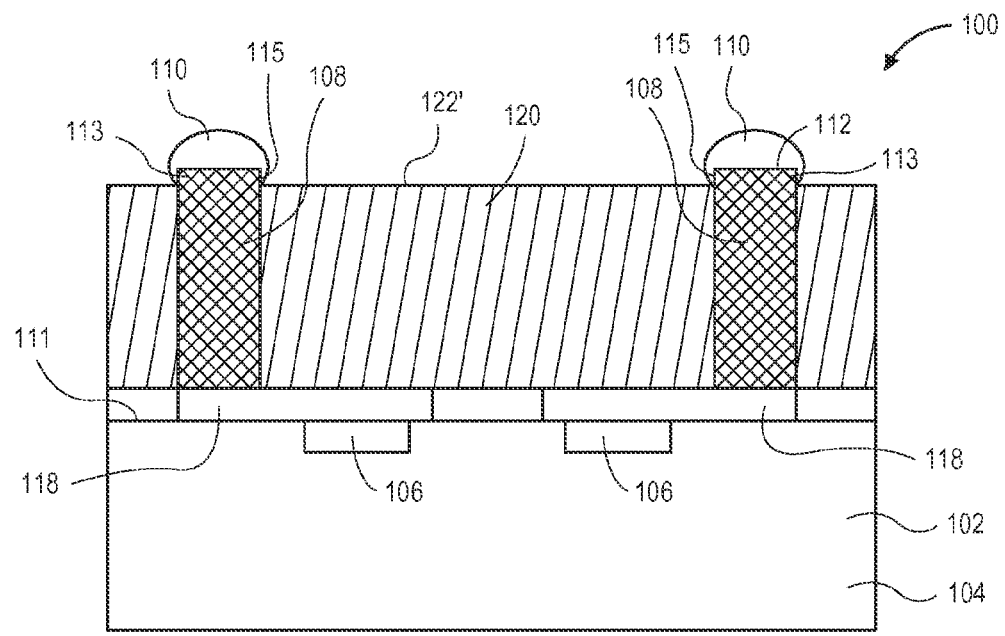
FIG. 2C is a diagrammatic partial-cross-sectional side elevation view of an example section of the wafer-level package device as shown in FIG. 1B taken along plane 2C-2C.
Figure 2D:
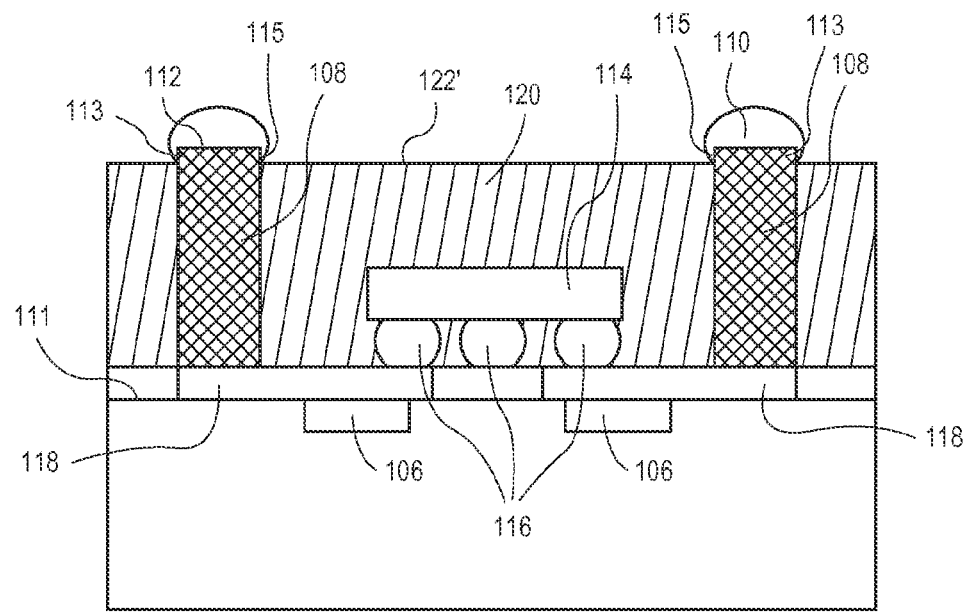
FIG. 2D is a diagrammatic partial-cross-sectional side elevation view of an example section of the wafer-level package device as shown in FIG. 1B taken along plane 2D-2D, wherein the wafer-level package device includes an integrated circuit device.

In the implementations shown in FIGS. 2C and 2D, the end portions 113 of the respective pillars 108 extend beyond the surface 122 of the encapsulation structure 120. The solder layer 110 is disposed on respective pillars 108 and at least substantially covers the end portions 113 the pillars 108 so that solder extends over at least part of the sidewall 115 of the portions 113 of the pillars 108 that extend beyond the encapsulation structure 120. In embodiments, as discussed herein, the encapsulation structure 120 may be etched to remove an outer section (layer) of the encapsulation structure 120. The end portion 113 of the pillar 108 may thus be exposed from the encapsulation structure 120 so that the end portion 113 extends beyond the plane defined by the etched surface 122' of the encapsulation structure 120. For example, in specific implementations, the end portion 113 may extend beyond the plane defined by the etched surface 122' by (e.g., have a sidewall 115 depth of) approximately ten micrometers (10 μm) to approximately 20 micrometers (20 μm). The solder of the solder layer 110 may cover the exposed end portion 113 so that the solder extends over the sidewall 115 of the end portion 113 of the pillar 108. In embodiments, the solder of the solder layer 110 may enclose the end portion 113 of the pillar 108 so that the end portion 113 of the pillar 108 is not exposed to the environment.

Figure 2E:
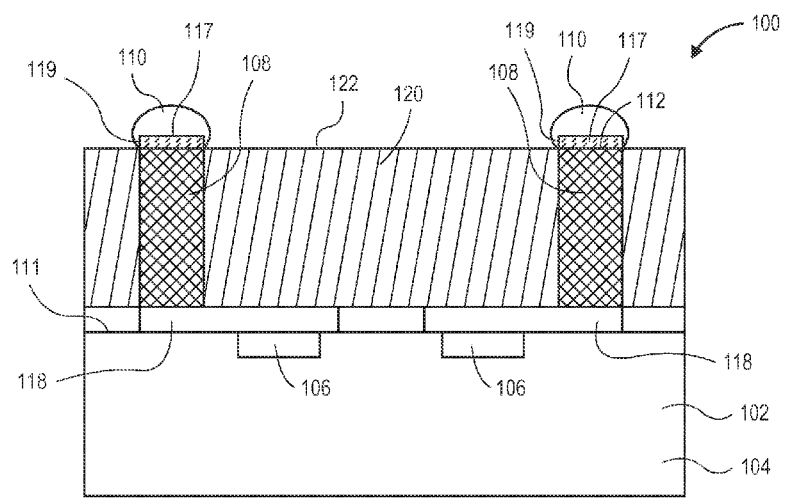
FIG. 2E is a diagrammatic partial-cross-sectional side elevation view of an example section of the wafer-level package device as shown in FIG. 1B taken along plane 2E-2E.
Figure 2F:
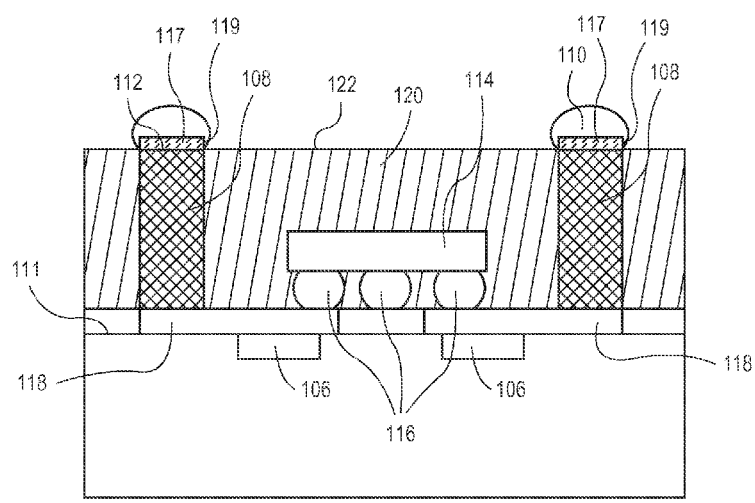
FIG. 2F is a diagrammatic partial-cross-sectional side elevation view of an example section of the wafer-level package device as shown in FIG. 1B taken along plane 2F-2F, wherein the wafer-level package device includes an integrated circuit device.

In the embodiments shown in FIGS. 2E and 2F, under bump metallization (UBM) 117 is applied over the outer surfaces 112 of the pillars 108, and, in some embodiments, portions of the surface 122 of the encapsulation structure 120 surrounding the pillars 108. The solder layer 110 is disposed on the under bump metallization (UBM) 117 disposed over respective pillars 108 and least substantially covers the under bump metallization (UBM) 117 so that solder extends over at least part of the sidewall 119 of the under bump metallization (UBM) 117. As shown, the under bump metallization (UBM) 117 extends beyond the plane defined by the surface 122 of the encapsulation structure 120. For example, in specific implementations, the under bump metallization (UBM) 117 may extend beyond the plane defined by the surface 122 by (e.g., have a sidewall 119 depth of) approximately ten micrometers (10 μm) to approximately 20 micrometers (20 μm). In embodiments, the solder of the solder layer 110 may enclose the under bump metallization (UBM) 117 so that the under bump metallization 117 is not exposed to the environment.

Figure 2G:
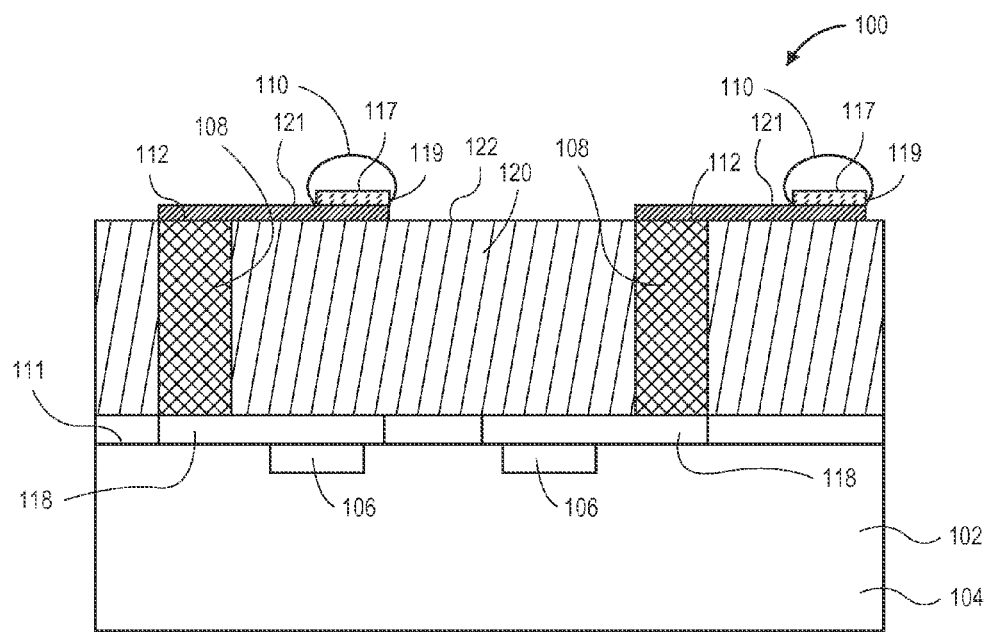
FIG. 2G is a diagrammatic partial-cross-sectional side elevation view of an example section of the wafer-level package device as shown in FIG. 1B taken along plane 2G-2G.
Figure 2H:
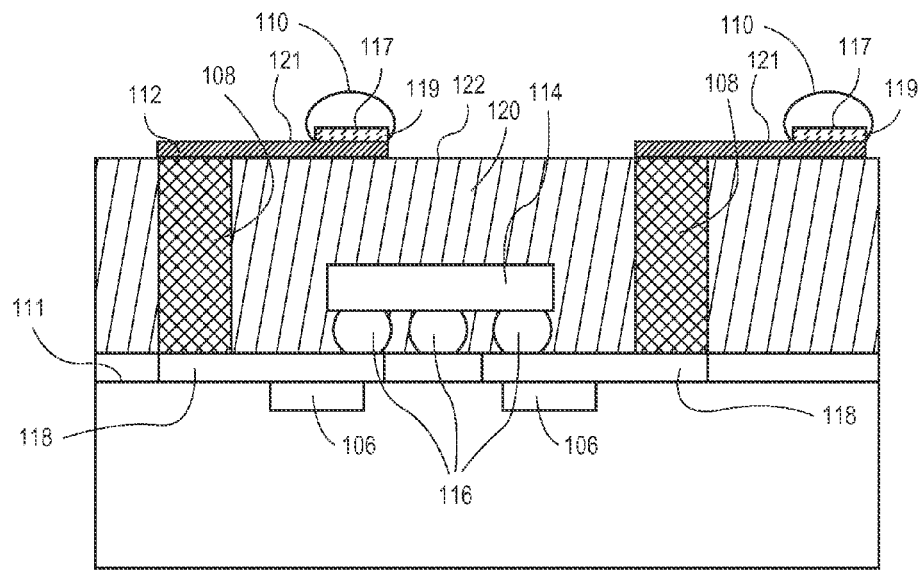
FIG. 2H is a diagrammatic partial-cross-sectional side elevation view of an example section of the wafer-level package device as shown in FIG. 1B taken along plane 2H-2H, wherein the wafer-level package device includes an integrated circuit device.

In the embodiments shown in FIGS. 2G and 2H, a redistribution layer (RDL) 121 is provided over the encapsulation structure 120 and pillar 108 to electrically connect the pillar 108 and the under bump metallization (UBM) 117, thereby facilitating redistribution of the connections (e.g., solder bumps 110) of the device 100. The configuration of the redistribution layer (RDL) 121 includes a redistribution (RDL) structure comprised of a thin-film metal (e.g., aluminum (Al), copper (Cu), etc.) rerouting and interconnection system that may redistribute the contact pads to an area array of bump interfaces (e.g., under bump metallization (UBM) 117 pads) that may be more evenly deployed over the device 100.

The under bump metallization (UBM) 117 may have a variety of compositions. For example, the under bump metallization (UBM) 117 may comprise a metal such copper (Cu). The under bump metallization (UBM) 117 may also include multiple layers of different metals (e.g., Aluminum (Al), Nickel (Ni), Copper (Cu), Vanadium (V), and so forth) that function as an adhesion layer, a diffusion barrier layer, a solderable layer, an oxidation barrier layer, and so forth. However, other UBM structures are possible.

Example Fabrication Processes

FIGS. 3A through 3D illustrate example processes 200 that employ wafer-level packaging techniques to fabricate semiconductor devices having pillars, such as the devices 100 shown in FIGS. 1A and 1B and FIGS. 2A through 2H. In the process 200 illustrated, one or more pillars are initially formed over a semiconductor wafer. As described herein, a dual lamination/deposition process may be employed to form the pillars. Accordingly, a first photoresist layer is formed over a semiconductor wafer (Block 202) prior to segmentation of the wafer into individual circuit chips (die). FIG. 4A illustrates a portion of the wafer 300, which, when processed through suitable FEOL fabrication techniques, includes a semiconductor substrate 302 that comprises an integrated circuit chip 304. The integrated circuit chip 304 includes one or more integrated circuits 306 formed therein. The substrate 302 may include a redistribution structure, such as a redistribution layer (RDL) 308, formed over the surface 310 of the substrate 302. As shown, a dielectric layer 312 may also be formed over the surface 310 of the substrate 302. The dielectric layer 312 may be benzocyclobutene polymer (BCB), silicon dioxide ($SiO_2$), or the like. The first lamination step includes applying a first photoresist layer 314 over the wafer 300 (e.g., over the RDL 308 and the dielectric layer 312). The first photoresist layer 314 may be a composition of photopolymer and polyester film that may be patterned and etched through one or more suitable dry film lamination processes.

Figure 4A:
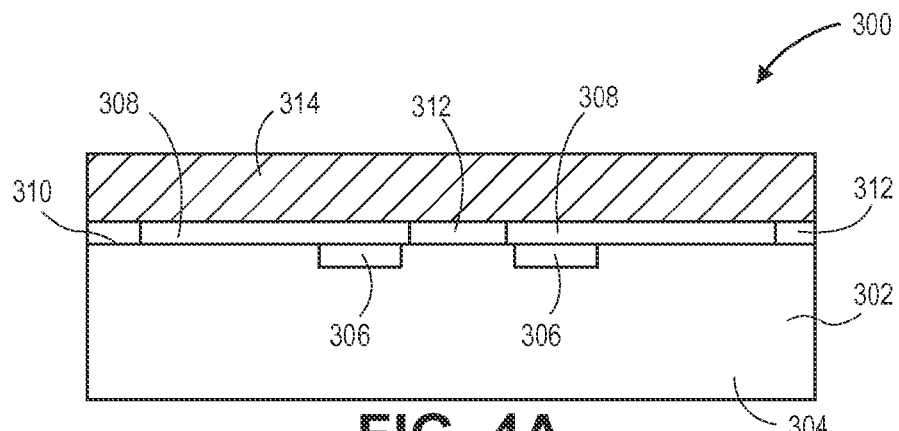
FIGS. 4A through 4U are diagrammatic partial cross-sectional side elevation views illustrating the fabrication of a wafer-level package device, such as the devices shown in FIGS. 1 through 2H, in accordance with the processes shown in FIGS. 3A through 3D.
Figure 4B:
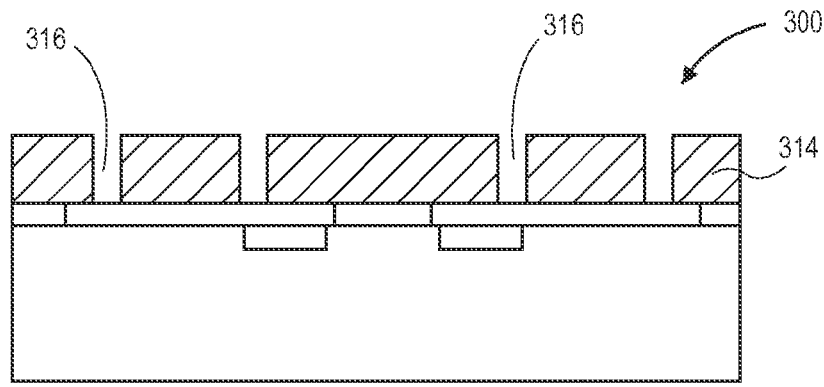

The first photoresist layer is then patterned and etched to form a first etched area (Block 204). FIG. 4B illustrates the first photoresist layer 314 which is shown patterned and etched to form first etched areas 316. The etched areas 316 extend at least through the first photoresist layer 314 to pads of the RDL layer 308.

Figure 4C:
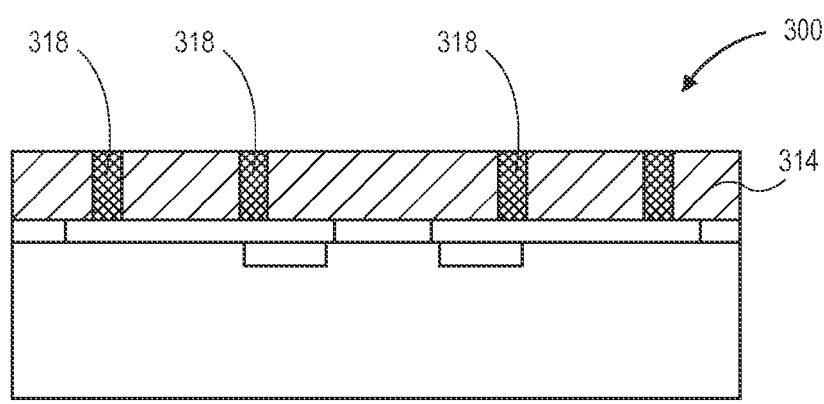

A conductive material is then deposited in the first etched area (Block 206). FIG. 4C illustrates the conductive material 318 deposited in the etched areas 316 of the wafer 300. In one or more implementations, a suitable electroplating process may be utilized to deposit a conductive material 318 in the etched areas 316 of the photoresist layer 314. The conductive material 318 may comprise copper, aluminum, or a like conducting metal, or other conducting material.

Figure 4D:
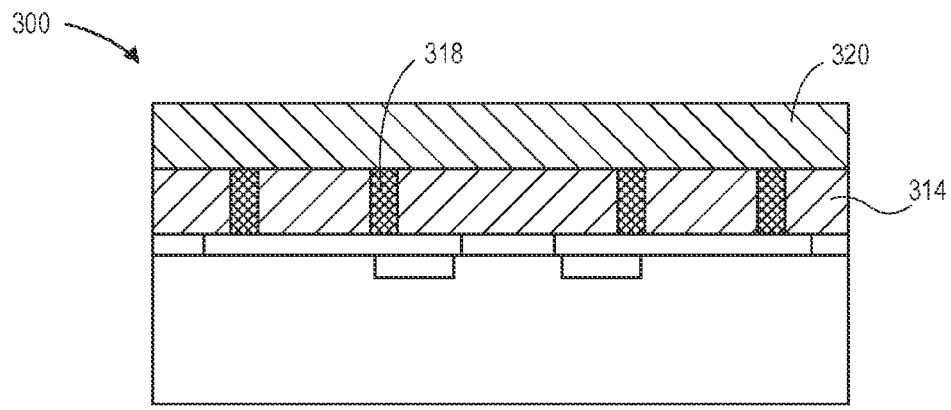
Figure 4E:
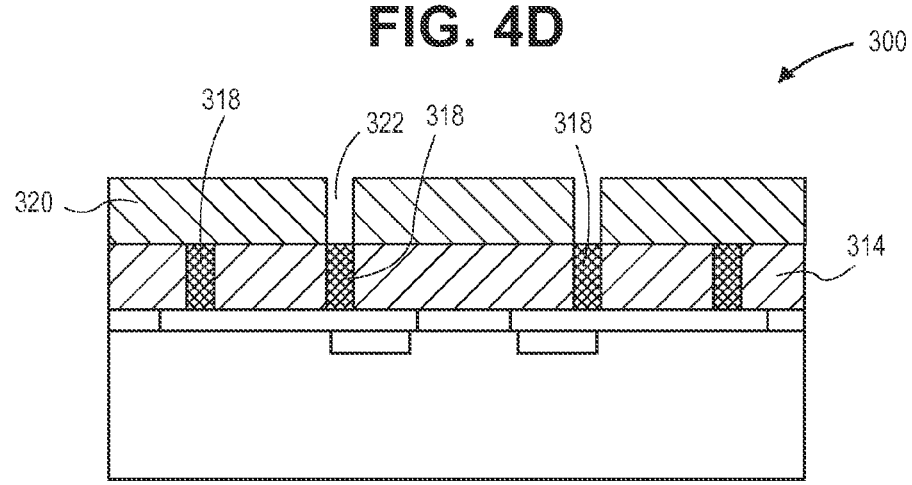

A second photoresist layer is then applied over the remaining first photoresist layer (Block 208) and the conductive material. FIG. 4D illustrates the second photoresist layer 320 deposited over the remaining first photoresist layer 314 and the conductive material 318. Once deposited, the second photoresist layer is patterned and etched to form a second etched area (Block 210). FIG. 4E illustrates the second photoresist layer 320 wherein the second photoresist layer 320 has been patterned and etched to form one or more second etched areas 322 positioned over the previously etched areas (e.g., first etched areas 316). The etched areas 322 extend the depth of the second photoresist layer 320 so that the conductive material 318 is at least partially exposed.

Figure 4F:
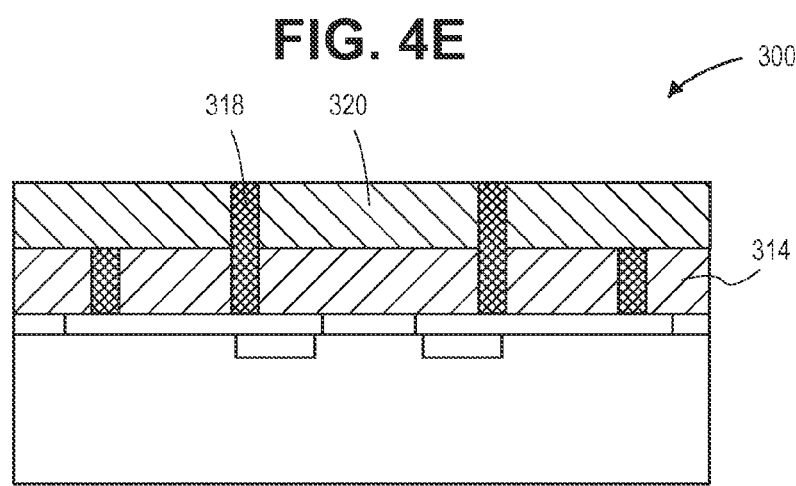

A conductive material is then deposited in the second etched area to complete formation of one or more pillars (Block 212). FIG. 4F illustrates conductive material 318 deposited in the etched areas 322 to form pillars 324. As shown, the conductive material 318 deposited in etched areas 322 is at least partially in contact with the conductive material 318 deposited in the etched areas 316. In one or more implementations, the conductive material 318 (e.g., copper, etc.) is electroplated in the etched areas 322 to form pillars 324 (e.g., copper pillars).

Figure 4G:
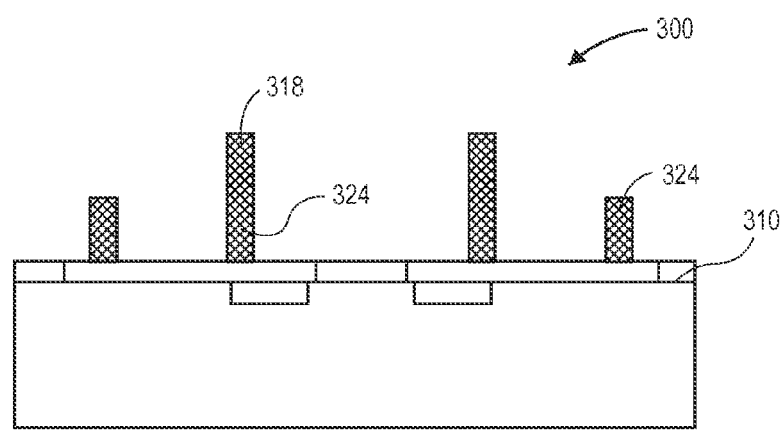

Once the pillars have been formed, the photoresist layers are removed (Block 214). FIG. 4G illustrates removal of the first and second photoresist layers 314, 320 (see FIG. 4F) through suitable stripping processes. In addition, the pillars 324 may be subjected to a suitable seed etch process. As described above, an integrated circuit chip device (shown in FIG. 2B) may be positioned over the substrate 302. An integrated circuit chip device may extend system-in-a-package capabilities to the integrated circuit chip 304.

Figure 4H:
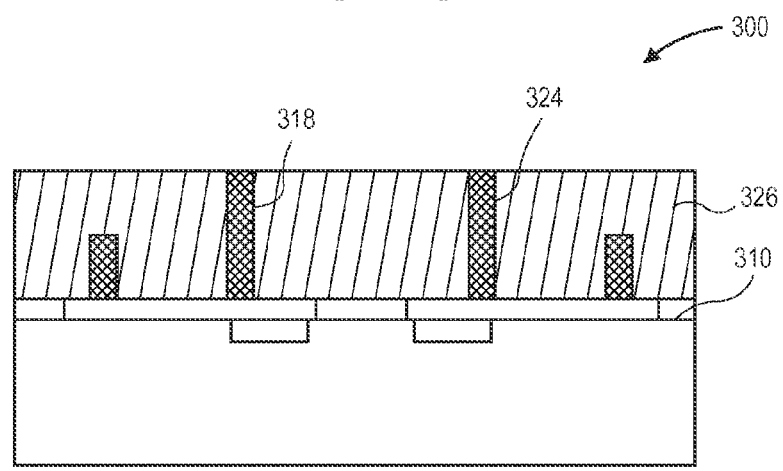

Once the pillars are formed, an encapsulation structure is formed over the wafer to at least substantially encapsulate the pillars (Block 216). FIG. 4H illustrates the encapsulation structure 326 formed over the surface 310 of the wafer 300 to provide support and insulation to the integrated circuits 306 and the pillars 324. In embodiments, multiple polymer layers (e.g., epoxy, etc.) may be deposited over the surface 310 to form the encapsulation structure 326. It is contemplated that an epoxy material may also be deposited on the backside (e.g., over the surface 328) of the wafer 300. Once formed, the encapsulation structure 326 may be subjected to a grinding process to expose pillars 324 (e.g., expose the end of the pillar 324 distal from the substrate 302). As shown, the encapsulation structure 326 extends at least substantially the length (e.g., depth or height) of the pillars 324. As shown in FIG. 4H, in an implementation, a first pillar 324 extends through at least substantially the entire encapsulation structure 326 (e.g., extends at least substantially the height of the encapsulation structure 326, the height of the first pillar 324 is same as height of the encapsulation structure 326) and a second pillar 324 extends only partially through the encapsulation structure 326. For example, the second pillar 324 may only extend halfway through the encapsulation structure 326 (e.g., the height of the second pillar 324 is at least approximately half the height of the encapsulation structure 326). However, it is understood that other pillar heights may be utilized according to the requirements of the wafer-level semiconductor package devices.

Figure 3A:
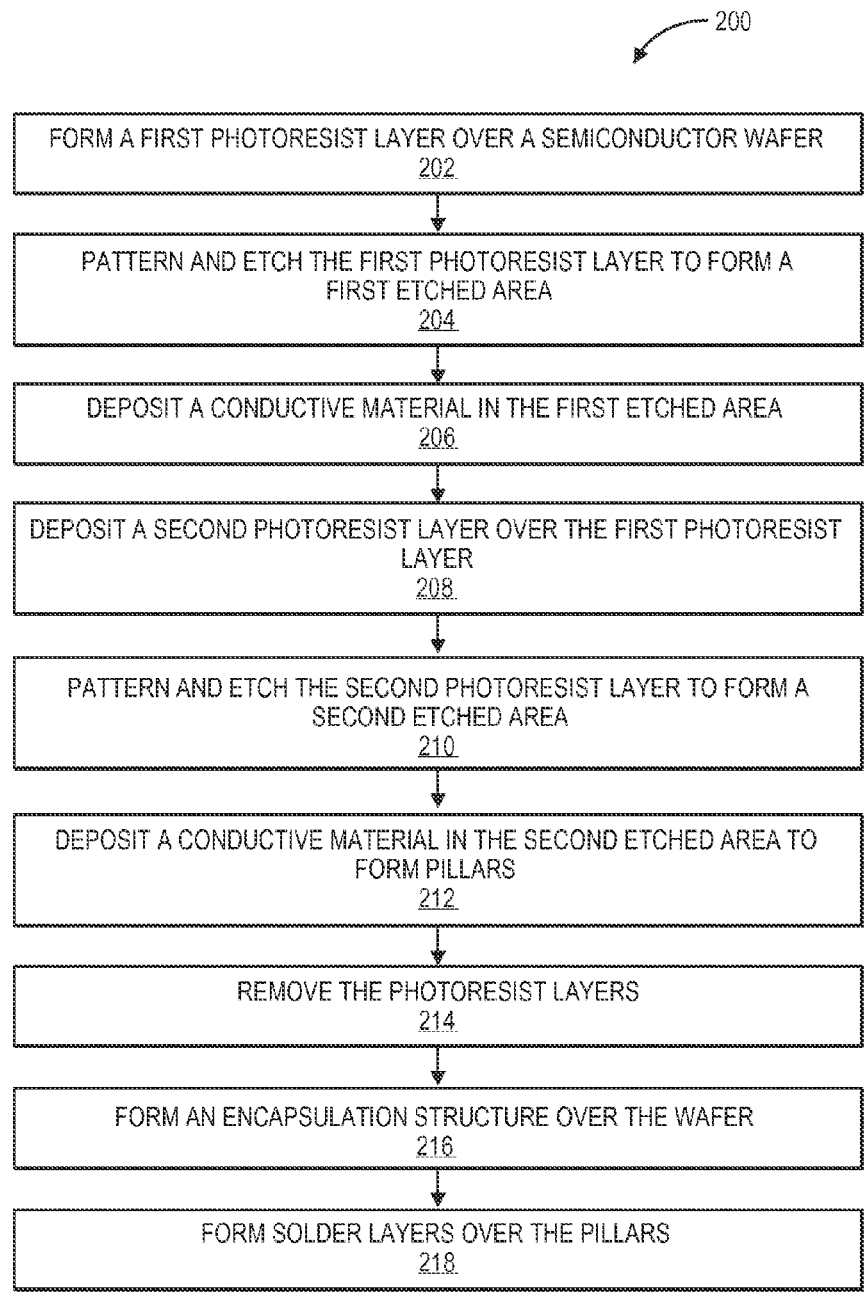
FIG. 3A through 3D are flow diagrams illustrating processes in example implementations for fabricating wafer-level package devices, such as the devices shown in FIGS. 1 through 2H.
Figure 4I:
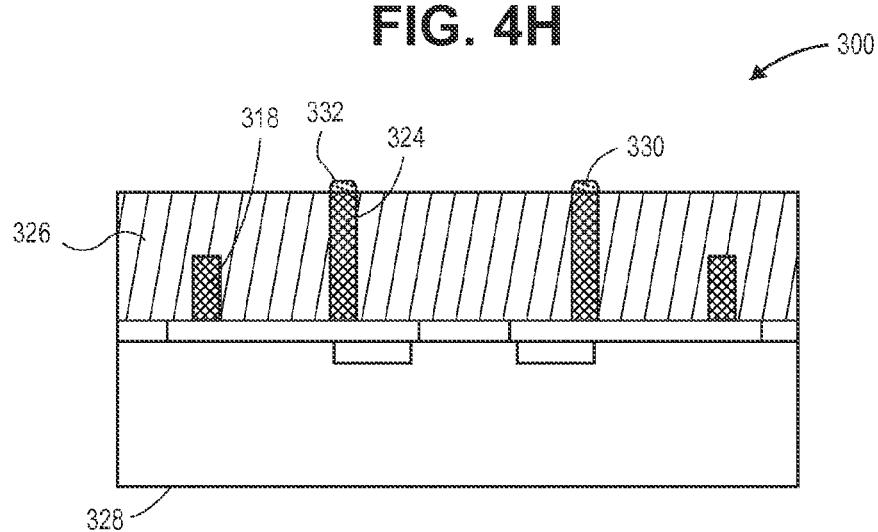

In the embodiment of the process 200 shown in FIG. 3A, a solder layer is then applied to the pillar (Block 218). For example, as shown in FIG. 4I, solder layers 330 (e.g., a solder finish) may be formed over (e.g., applied to) the exposed surfaces 332 of the pillars 324 (e.g., the ends of the pillars 324 distal to the wafer 300). In an implementation, the wafer 300 may be subjected to a suitable dip-soldering process to apply the solder layers 330 over the exposed copper pillar leads. Once the dip-soldering process is complete, suitable processes may be employed to segment the individual integrated circuit chips 304 into individual packages.

Figure 3B:
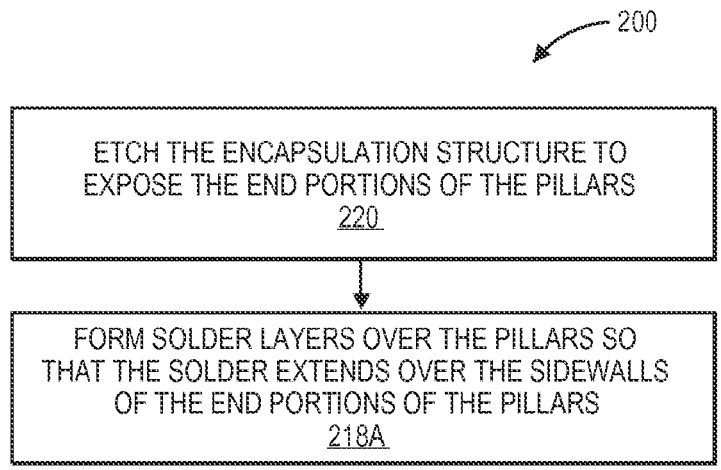
Figure 4J:
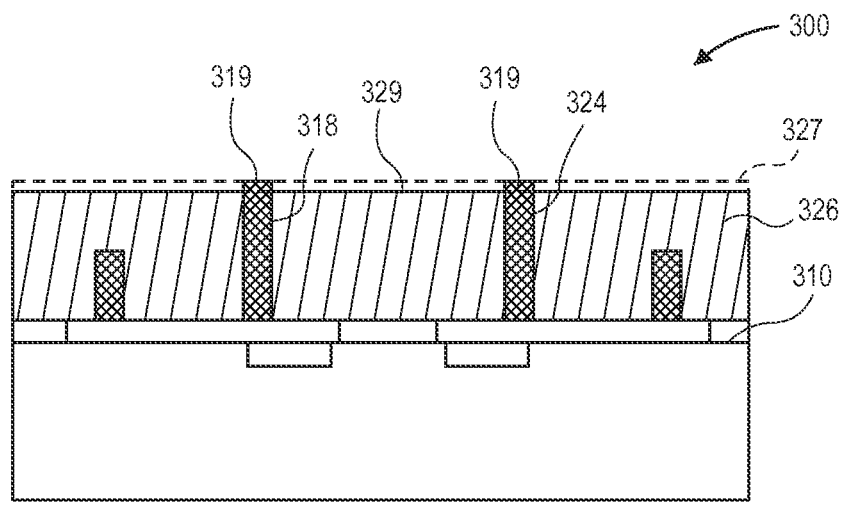

In the embodiment of the process 200 shown in FIG. 3B, the encapsulation structure is etched to expose end portions of the pillars (Block 220) prior to formation of the solder layers (Block 218, FIG. 3A). For example, as shown in FIG. 4J, the encapsulation structure 326 may be etched to remove an outer section (layer) 327 of the encapsulation structure 326. The encapsulation structure 326 may be etched using a dry etch process, such as a plasma etch process, or the like, or may be etched using a wet etch process. In embodiments, the etching process may be timed to control the thickness of the section (layer) 327 of the encapsulation structure 326 removed. For example, in a specific embodiments, a dry etch having a duration of approximately ten (10) minutes or a wet etch having a duration of approximately five (5) minutes may be employed to remove a section (layer) 327 of the encapsulation structure 326 having a thickness of approximately ten micrometers (10 μm) to approximately 20 micrometers (20 μm). The end portions 319 of the pillars 324 may thus be exposed from the encapsulation structure 326 so that the end portions 319 extend beyond the plane defined by the etched surface 329 of the encapsulation structure 326. For example, in specific implementations described, the end portions 319 may extend beyond the plane defined by the etched surface 329 by (e.g., have a sidewall 321 depth of) approximately ten micrometers (10 μm) to approximately 20 micrometers (20 μm).

Figure 4K:
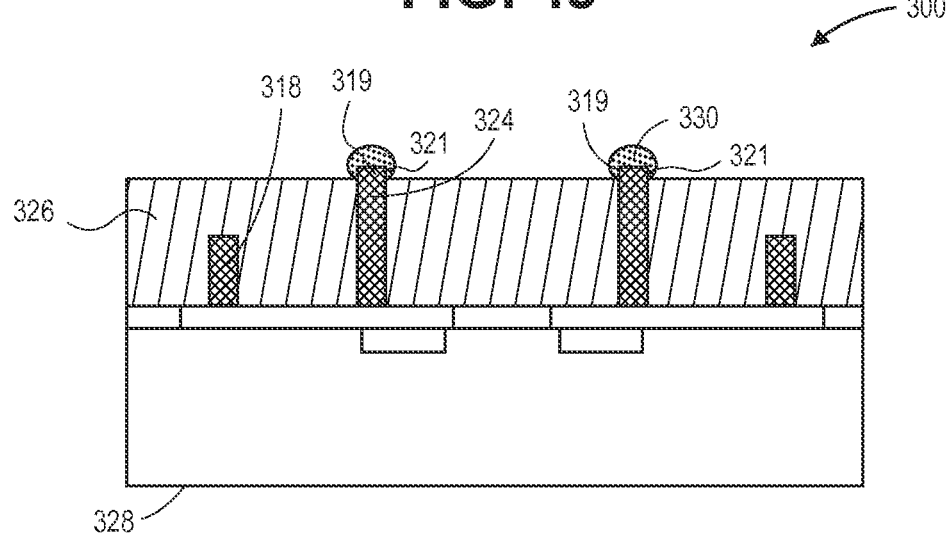

Solder layers are then formed over the pillars so that the solder extends over the end portions of the pillars (Block 218A). FIG. 4K illustrates the solder layer 330 formed over (e.g., applied to) the exposed end portions 319 of the pillars 324 (e.g., the ends of the pillars 324 distal to the wafer 300). As shown, the solder layer 330 may at least substantially cover the end portions 319 the pillars 108 so that solder extends over at least part of the sidewall 321 of the portions 319 of the pillars 324 that extend beyond the encapsulation structure 326. In embodiments, the solder of the solder layer 330 may enclose the end portions 319 of the pillars 324 so that the end portions 319 are not exposed to the environment. In an implementation, the wafer 300 may be subjected to a suitable dip-soldering process to apply the solder layers 330 over the exposed copper pillar leads. Once the dip-soldering process is complete, suitable processes may be employed to segment the individual integrated circuit chips 304 into individual packages.

Figure 3C:
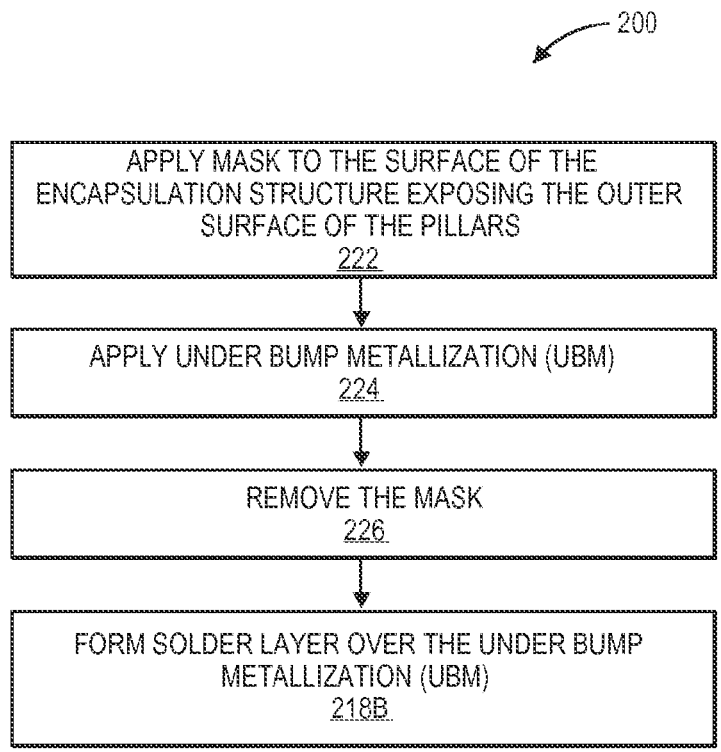
Figure 4L:
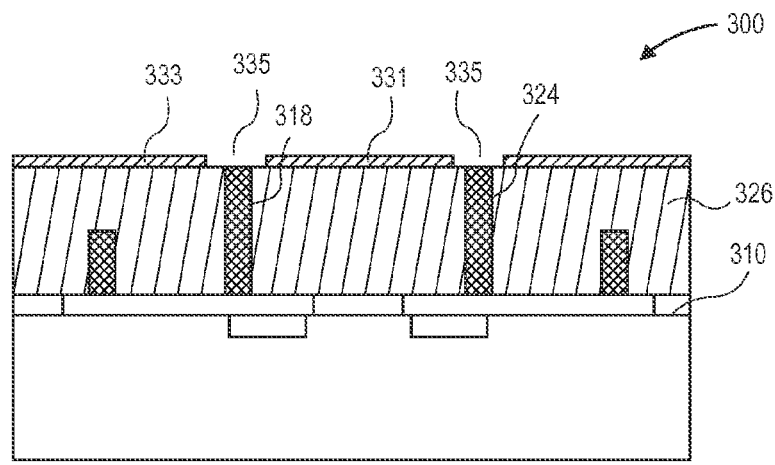

In the embodiment of the process 200 shown in FIG. 3C, under bump metallization (UBM) is applied over the outer surfaces of the pillars, and, in some embodiments, portions of the surface of the encapsulation structure surrounding the pillars. As shown, a mask is applied to the surface of the encapsulation structure exposing the outer surface of the pillars (Block 222). FIG. 4L illustrates a mask 331 applied to the surface 333 of the encapsulation structure 326 in an example implementation. In embodiments, the mask 331 may comprise a photoresist mask, an appliqué, and so forth. Openings 335 are formed (e.g., patterned) in the mask 331 over the pillars 324.

Figure 4M:
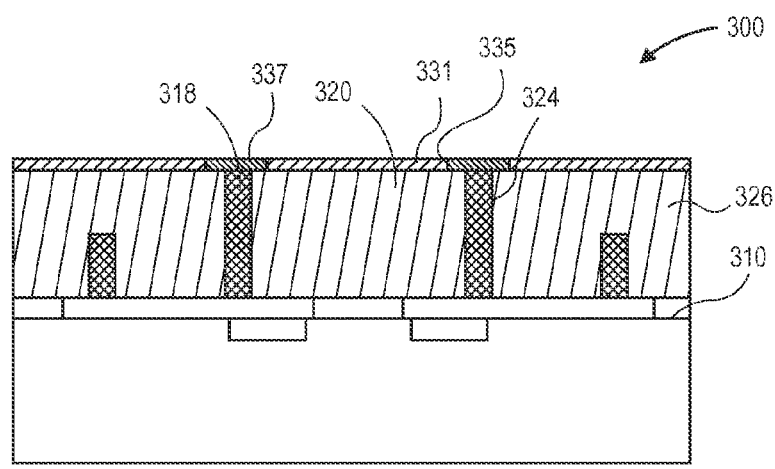

Under bump metallization is then applied (UBM) (Block 224). FIG. 4M illustrates under bump metallization (UBM) 337 applied within the openings 335 formed in the mask 331 over the pillars 324. The under bump metallization (UBM) 337 may have a variety of compositions. For example, the under bump metallization (UBM) 337 may comprise a metal such a copper (Cu). The under bump metallization (UBM) 337 may also include multiple layers of different metals (e.g., Aluminum (Al), Nickel (Ni), Copper (Cu), Vanadium (V), and so forth) that function as an adhesion layer, a diffusion barrier layer, a solderable layer, an oxidation barrier layer, and so forth. However, other under bump metallization (UBM) structures are possible. The under bump metallization (UBM) may be applied using suitable processes such as deposition processes, sputtering process, and so forth.

Figure 4N:
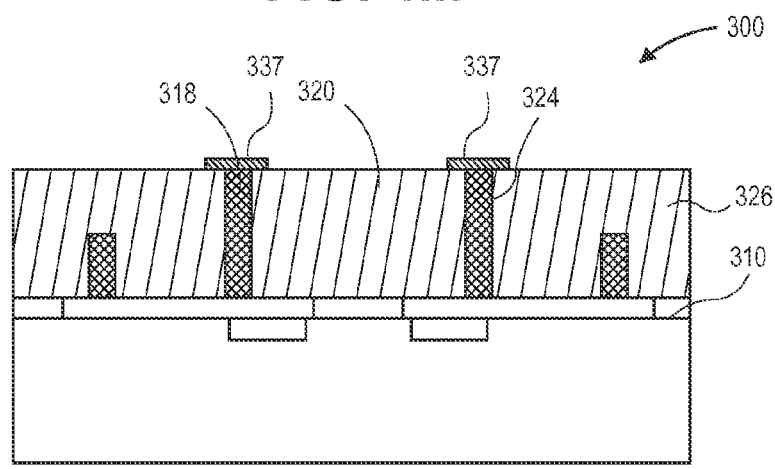

The mask may then be removed (Block 226). FIG. 4N illustrates removal of the mask 331 leaving the under bump metallization (UBM) formed over the pillars 324 and encapsulation structure 326. As shown, the under bump metallization (UBM) 337 extends beyond the plane defined by the surface 333 of the encapsulation structure 324. For example, in specific implementations, the under bump metallization (UBM) 337 may extend beyond the plane defined by the surface 333 by approximately ten micrometers (10 μm) to approximately 20 micrometers (20 μm).

Figure 4O:
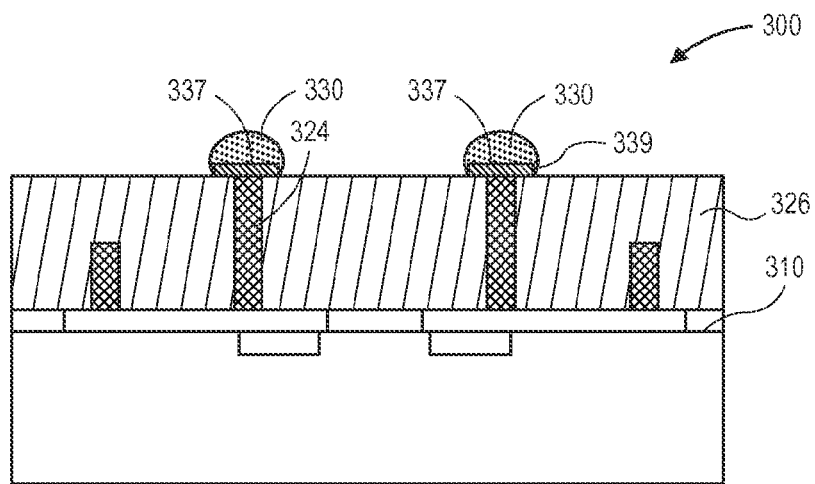

Solder layers are formed over the under bump metallization so that the solder extends over the under bump metallization (Block 218B). FIG. 4O illustrates the solder layer 330 formed over (e.g., applied to) the under bump metallization 337. As shown, the solder layer 330 may at least substantially cover the under bump metallization 337 so that solder extends over at least part of the sidewall 339 of the under bump metallization 337. In embodiments, the solder of the solder layer 330 may enclose under bump metallization (UBM) so that the under bump metallization (UBM) is not exposed to the environment. In an implementation, the wafer 300 may be subjected to a suitable dip-soldering process to apply the solder layers 330 over the under bump metallization 337. Once the dip-soldering process is complete, suitable processes may be employed to segment the individual integrated circuit chips 304 into individual packages.

Figure 3D:
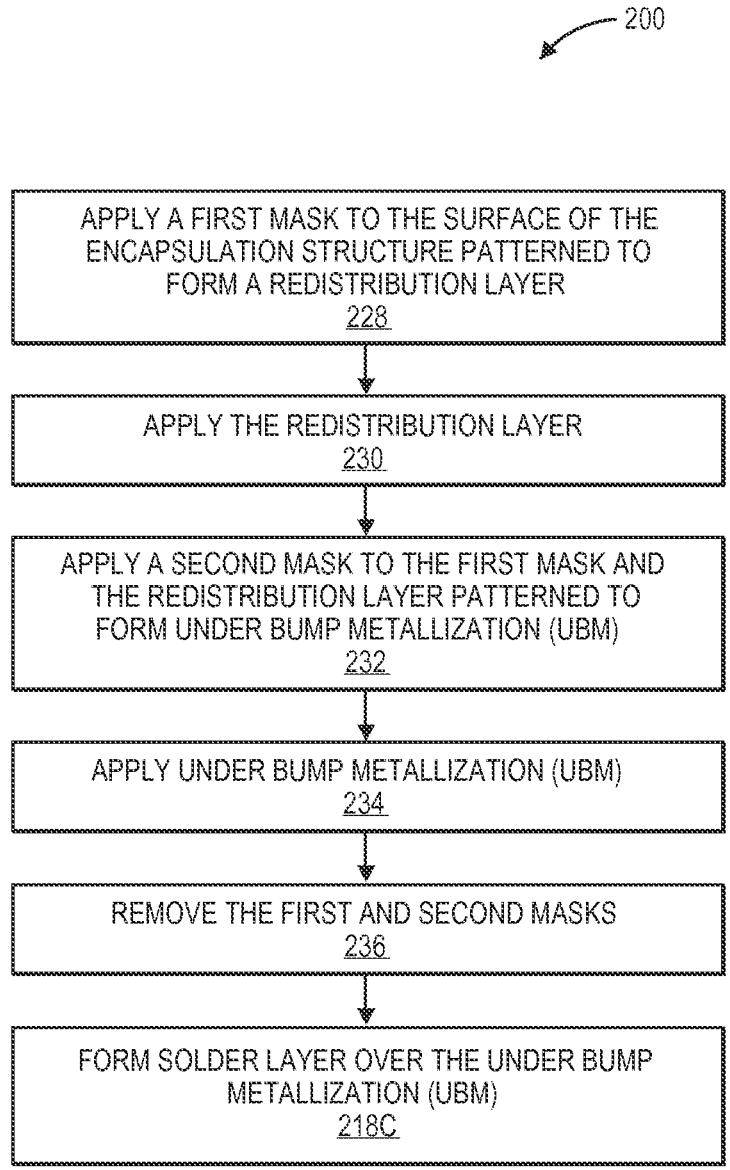
Figure 4P:
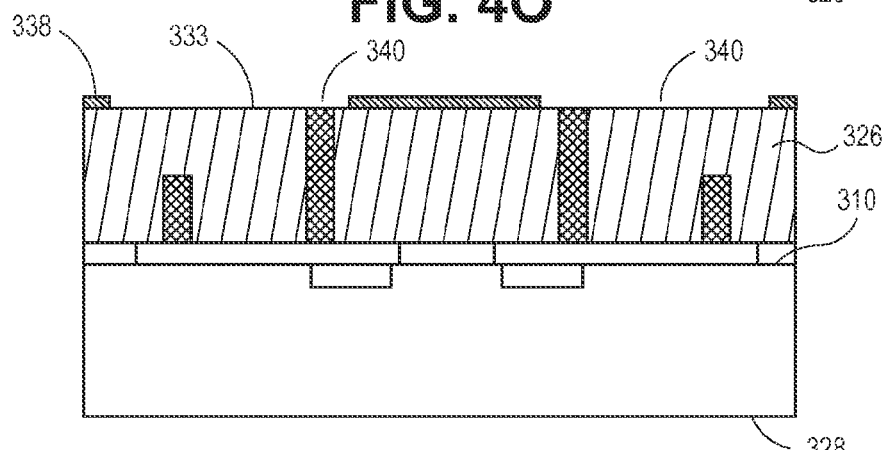

In the embodiment of the process 200 shown in FIG. 3D, a redistribution layer (RDL) 121 is provided over the encapsulation structure 120 and pillar 108 to electrically connect the pillar 108 and the under bump metallization (UBM) 117, thereby facilitating redistribution of the connections (e.g., solder bumps 110) of the device 100. As shown, a first mask is applied to the surface of the encapsulation structure (Block 228). The first mask is patterned to form a redistribution layer over the surface of the encapsulation structure. FIG. 4P illustrates a first mask 338 applied to the surface 333 of the encapsulation structure 326 in an example implementation. In embodiments, the first mask 338 may comprise a photoresist mask, an appliqué, and so forth. Openings 340 are formed (e.g., patterned) in the mask 331 over the pillars 324 and encapsulation structure 326.

Figure 4Q:
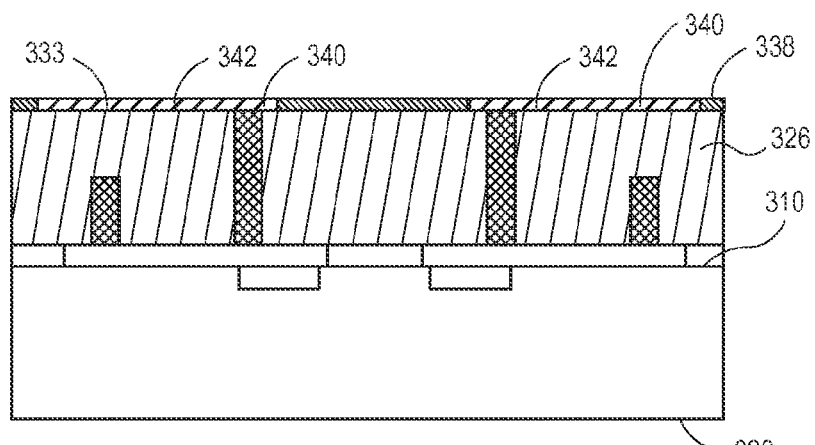

The redistribution layer (RDL) is then applied (Block 230). FIG. 4Q illustrates application of the redistribution layer (RDL) 342. The redistribution layer (RDL) may be formed from one or more layers of thin-film metal (e.g., aluminum (Al), copper (Cu), etc.), which may be applied using suitable processes such as deposition processes, sputtering process, and so forth. In the embodiments, the configuration of the redistribution layer (RDL) 342 includes a redistribution (RDL) structure comprised of a rerouting and interconnection system that may redistribute the pillars 324 to an area array of bump interfaces (e.g., under bump metallization (UBM) pads) that may be more evenly deployed over the surface.

Figure 4R:
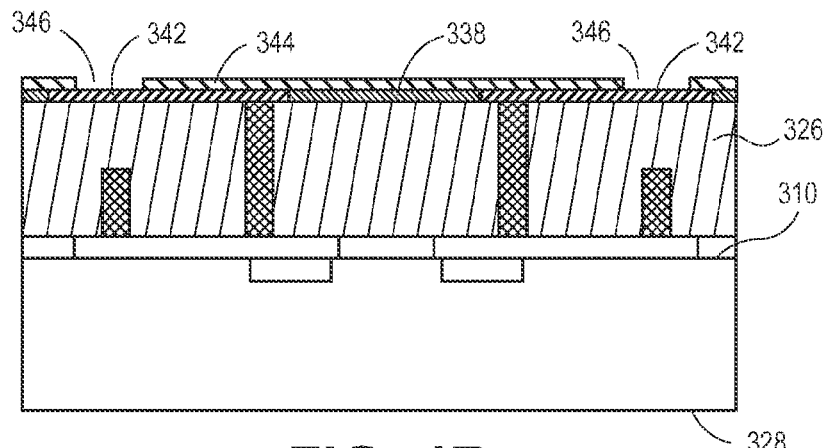

A second mask is applied to the surface of the first mask and the redistribution layer (Block 232). The second mask is patterned to form under bump metallization (UBM) pads. FIG. 4R illustrates a second mask 344 applied over the first mask 338 and the redistribution layer 342 in an example implementation. In embodiments, the second mask 344 may comprise a photoresist mask, an appliqué, and so forth. Openings 346 are formed (e.g., patterned) in the second mask 344 over the redistribution layer (RDL) 342.

Figure 4S:
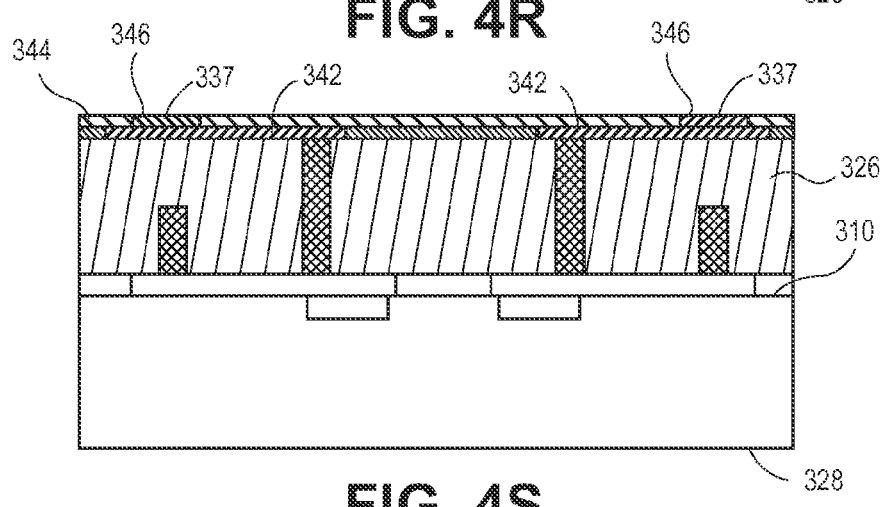

Under bump metallization is applied (UBM) (Block 236). FIG. 4S illustrates under bump metallization (UBM) 337 applied within the openings 346 formed in the second mask 344 over the redistribution layer (RDL) 342. The under bump metallization (UBM) 337 may have a variety of compositions. For example, the under bump metallization (UBM) 337 may comprise a metal such a copper (Cu). The under bump metallization (UBM) 337 may also include multiple layers of different metals (e.g., Aluminum (Al), Nickel (Ni), Copper (Cu), Vanadium (V), and so forth) that function as an adhesion layer, a diffusion barrier layer, a solderable layer, an oxidation barrier layer, and so forth. However, other under bump metallization (UBM) structures are possible. The under bump metallization (UBM) may be applied using suitable processes such as deposition processes, sputtering process, and so forth.

Figure 4T:
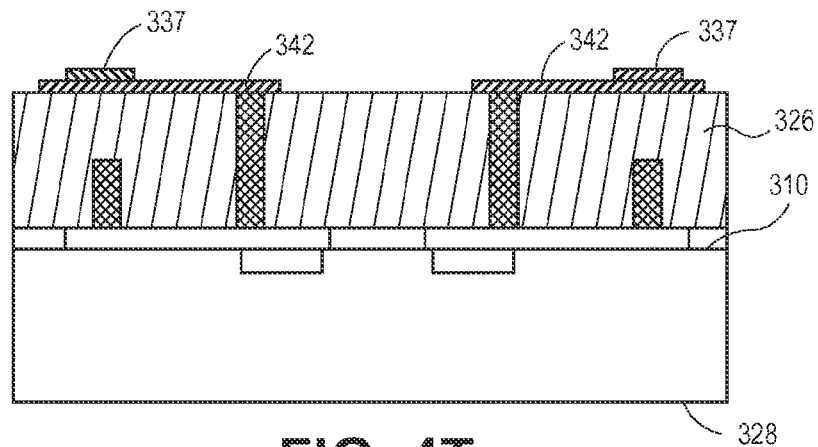
Figure 4U:
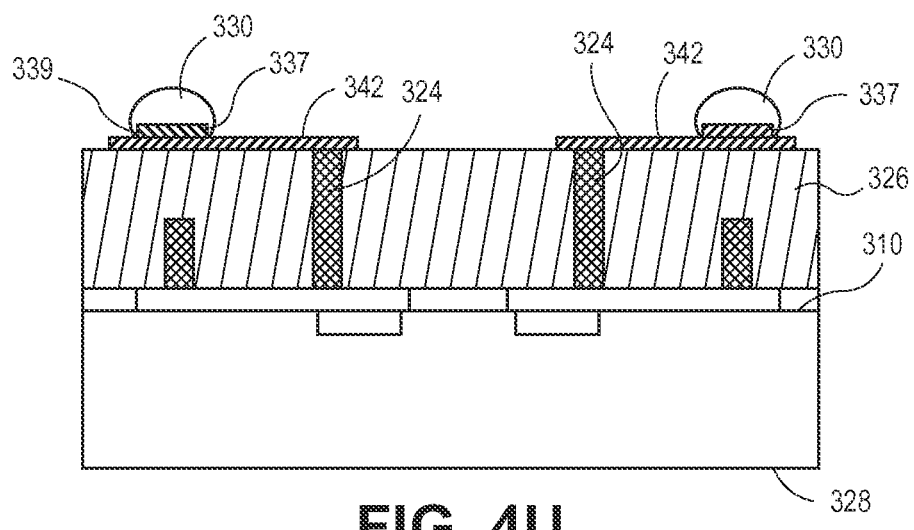

The first and second masks may then be removed (Block 236). FIG. 4T illustrates the wafer 300 following removal of the first mask 338 and the second mask 344 leaving the under bump metallization (UBM) 337 formed over the redistribution layer (RDL) 342, which in turn interconnects the under bump metallization (UBM) 337 with respective pillars 324. In embodiments, the first and second masks are not removed. In such embodiments, the first and second masks 338, 344 may comprise protective materials (e.g., a polymer) that may be left in place to protect the redistribution layer (RDS) and/or the surface of the encapsulation structure 326. In such instances, the under bump metallization (UBM) may extend over the protective layers.

Solder layers are formed over the under bump metallization so that the solder extends over under bump metallization (Block 218C). FIG. 4O illustrates the solder layer 330 formed over (e.g., applied to) the under bump metallization 337. As shown, the solder layer 330 may at least substantially cover the under bump metallization 337 so that solder extends over at least part of the sidewall 339 of the under bump metallization 337. In embodiments, the solder of the solder layer 330 may enclose under bump metallization (UBM) 337 so that the under bump metallization (UBM) 337 is not exposed to the environment. In an implementation, the wafer 300 may be subjected to a suitable dip-soldering process to apply the solder layers 330 over the under bump metallization 337. Once the dip-soldering process is complete, suitable processes may be employed to segment the individual integrated circuit chips 304 into individual packages.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A process comprising:
   forming at least one pillar over a semiconductor wafer;
   forming an encapsulation structure over the semiconductor wafer, the encapsulation structure at least substantially encapsulating the at least one pillar;
   etching the encapsulation structure to remove an outer section of the encapsulation structure so that a portion of the at least one pillar extends beyond the encapsulation structure; and
   applying a solder layer to the at least one pillar, the solder layer extending over at least part of a sidewall of the portion of the at least one pillar that extends beyond the encapsulation structure.

2. The process as recited in claim 1, wherein the etching of the encapsulation structure comprises using a dry etch process to etch the encapsulation structure.

3. The process as recited in claim 2, wherein the dry etch process comprises a plasma etch process.

4. The process as recited in claim 1, wherein the etching of the encapsulation structure comprises using a wet etch process to etch the encapsulation structure.

5. The process as recited in claim 1, wherein forming at least one pillar further comprises:
   applying a first photoresist layer over the semiconductor wafer;
   patterning and at least partially etching the first photoresist layer to form a first etched area;
   depositing conductive material in the first etched area;
   applying a second photoresist layer over the first photoresist layer;
   patterning and at least partially etching the second photoresist layer to form a second etched area, the second etched area formed over the first etched area;
   depositing conductive material in the second etched area to form the at least one pillar; and
   at least substantially removing the first photoresist layer and the second photoresist layer.

6. The process as recited in claim 1, wherein forming an encapsulation structure further comprises depositing an epoxy material over the semiconductor wafer, the encapsulation structure at least partially encapsulating the at least one pillar.

7. The process as recited in claim 1, wherein the at least one pillar comprises a copper pillar.

8. A wafer-level package device comprising:
   an integrated circuit die having a surface;
   an encapsulation structure disposed over the surface;
   at least one pillar extending from the surface through the encapsulation structure, the at least one pillar having an end distal from the surface including a portion that extends beyond the encapsulation structure, the at least one pillar configured to provide an electrical interconnection to the integrated circuit die; and
   a solder layer disposed over the end of the at least one pillar, the solder layer extending from the encapsulation structure over a vertical sidewall of the portion of the at least one pillar that extends beyond the encapsulation structure.

9. The wafer-level package device as recited in claim 8, wherein the at least pillar comprises a copper pillar.

10. The wafer-level package device as recited in claim 8, wherein the encapsulation structure comprises an epoxy material.

11. The wafer-level package device as recited in claim 8, wherein the at least one pillar comprises a plurality of pillars extending from the surface of the integrated circuit die.

12. A process comprising:
   forming at least one pillar over a semiconductor wafer;
   forming an encapsulation structure over the semiconductor wafer, the encapsulation structure at least substantially encapsulating the at least one pillar;
   applying under bump metallization (UBM) over the at least one pillar; and
   applying a solder layer to the under bump metallization (UBM), the solder layer extending from the encapsulation structure over a vertical sidewall of the under bump metallization (UBM).

13. The process as recited in claim 12, wherein the application of the under bump metallization (UBM) comprises:
   applying a mask over an outer surface of the encapsulation structure, the mask exposing an outer surface of the at least one pillar;
   applying the under bump metallization (UBM) over the outer surface of the at least one pillar; and
   removing the mask.

14. The process as recited in claim 12, further comprising forming a redistribution layer (RDL) over the encapsulation structure, the redistribution layer (RDL) electrically connecting the at least one pillar and the under bump metallization (UBM).

15. The process as recited in claim 14, wherein the forming of the redistribution layer (RDL) and the applying of the under bump metallization comprises:
   applying a first mask over an outer surface of the encapsulation structure, the first mask exposing an outer surface of the at least one pillar and patterned to form the redistribution layer (RDL);
   applying the redistribution layer (RDL);
   applying a second mask over the first mask and the redistribution layer (RDL), the second mask exposing at least a portion of the redistribution layer (RDL) and patterned to form the under bump metallization (UBM);
   applying the under bump metallization (UBM); and
   removing the first mask and the second mask.

16. The process as recited in claim 12, wherein forming at least one pillar further comprises:
   applying a first photoresist layer over the semiconductor wafer;
   patterning and at least partially etching the first photoresist layer to form a first etched area;
   depositing conductive material in the first etched area;
   applying a second photoresist layer over the first photoresist layer;
   patterning and at least partially etching the second photoresist layer to form a second etched area, the second etched area formed over the first etched area;
   depositing conductive material in the second etched area to form the at least one pillar; and
   at least substantially removing the first photoresist layer and the second photoresist layer.

17. The process as recited in claim 12, wherein forming an encapsulation structure further comprises depositing an epoxy material over the semiconductor wafer, the encapsulation structure at least partially encapsulating the at least one pillar.

18. The process as recited in claim 12, wherein the at least one pillar comprises a copper pillar.

19. A wafer-level package device comprising:
   an integrated circuit die having a surface;
   at least one pillar extending from the surface, the at least one pillar having an end distal from the surface, the at least one pillar configured to provide an electrical interconnection to the integrated circuit die;
   an encapsulation structure disposed over the surface, the encapsulation structure at least partially enclosing the at least one pillar;
   under bump metallization (UBM) disposed over the at least one pillar and encapsulation structure; and
   a solder layer disposed over the end of the at least one pillar, the solder layer extending from the encapsulation structure over a vertical sidewall of the under bump metallization (UBM).

20. The wafer-level package device as recited in claim 19, wherein the at least pillar comprises a copper pillar.

21. The wafer-level package device as recited in claim 19, wherein the encapsulation structure comprises an epoxy material.

22. The wafer-level package device as recited in claim 19, further comprising a redistribution layer (RDL) disposed over the encapsulation structure and at least one pillar, the redistribution layer (RDL) electrically connecting the at least one pillar and the under bump metallization (UBM).

\* \* \* \* \*